United States Patent [19]
Rosvold

[11] 3,981,791
[45] Sept. 21, 1976

[54] VACUUM SPUTTERING APPARATUS

[75] Inventor: Warren C. Rosvold, Sunnyvale, Calif.

[73] Assignee: Signetics Corporation, Sunnyvale, Calif.

[22] Filed: Mar. 10, 1975

[21] Appl. No.: 556,584

[52] U.S. Cl. ................................. 204/298; 118/49; 118/49.1; 118/49.5; 118/50; 118/50.1
[51] Int. Cl.² .................... C23C 15/00; C23C 13/08
[58] Field of Search ........... 204/192, 298; 118/49.1, 118/50.1, 49, 50, 49.5

[56] References Cited
UNITED STATES PATENTS

| | | | |
|---|---|---|---|
| 3,568,632 | 3/1971 | Cawthon | 118/49 |
| 3,652,444 | 3/1972 | Lester et al. | 204/298 |
| 3,776,830 | 12/1973 | Endo | 204/192 |
| 3,827,966 | 8/1974 | Needham | 204/192 |
| 3,856,654 | 12/1974 | George | 204/298 |
| 3,874,525 | 4/1975 | Hassan et al. | 214/17 B |

OTHER PUBLICATIONS

C. H. George, "Cylindrical Diode continuous vacuum Sputtering Equipment for Laboratory & High Volume Production," J. Vac. Sci. Tech., vol. 10, No. 2, Mar.-/Apr. 1973, pp. 393-397.

*Primary Examiner*—John H. Mack
*Assistant Examiner*—Aaron Weisstuch
*Attorney, Agent, or Firm*—Flehr, Hohbach, Test, Albritton & Herbert

[57] ABSTRACT

Vacuum sputtering apparatus for treating articles having a housing forming a main vacuum chamber with a plurality of work stations therein. A lock chamber is provided in the main vacuum chamber through which articles can be inserted and removed. Means is provided in the main vacuum chamber for advancing the articles sequentially through the work stations in the main chamber so that as articles are being removed from the lock chambers, articles which have passed through the work stations can be removed from the main vacuum chamber through the lock chamber.

In the method articles are introduced into the main vacuum chamber through a lock chamber, and they are intermittently progressively advanced through a plurality of work stations in the main vacuum chamber and then are removed through the lock chamber.

8 Claims, 6 Drawing Figures

VACUUM SPUTTERING APPARATUS

BACKGROUND OF THE INVENTION

Vacuum sputtering apparatus has heretofore been provided. However, such vacuum sputtering systems typically have been of the batch load type which has a limited capacity. There is, therefore, a need for a new and improved vacuum sputtering apparatus which has substantially increased capabilities.

SUMMARY OF THE INVENTION AND OBJECTS

The vacuum sputtering apparatus is for treating articles. A housing is provided which forms a main vacuum chamber having a plurality of work stations therein. Means is connected to the main vacuum chamber for forming a vacuum in the vacuum chamber. The housing has a wall with an opening formed therein through which articles can be inserted into and removed from the main vacuum chamber. First and second sealing members are provided for forming a sealing engagement with opposite sides of the wall of the housing and form in combination with the wall of the housing a lock chamber. Means is provided for moving the first and second sealing members into and out of engagement with the wall whereby when the first sealing member is out of engagement with the wall, articles can be inserted into the lock chamber and when the second sealing member is out of engagement with the wall, articles can be removed from the lock chamber. Means is provided for intermittently advancing articles from the lock chamber and intermittently progressively moving the same through the work stations and back into the lock chamber whereby the articles upon which operations have been performed can be removed.

In general, it is an object of the present invention to provide a vacuum sputtering apparatus and method which has greatly increased capabilities.

Another object of the invention is to provide an apparatus and method of the above character in which a single lock chamber is utilized for both loading and unloading the main vacuum chamber.

Another object of the invention is to provide an apparatus and method of the above character in which an intermittent rotary system is utilized for advancing the articles through the work stations.

Another object of the invention is to provide an apparatus and method of the above character which has a greatly simplified mode of operation particularly in that the articles are inserted into the main vacuum chamber and moved therefrom at the same operator station.

Another object of the invention is to provide an apparatus of the above character in which anodized aluminum is utilized for the housing because of its hygroscopic properties.

Additional objects and features of the invention will appear from the following description in which the preferred embodiment is set forth in detail in conjunction with the accompanying drawings.

DESCRIPTION OF THE PREFERRED EMBODIMENT

Figure 1:
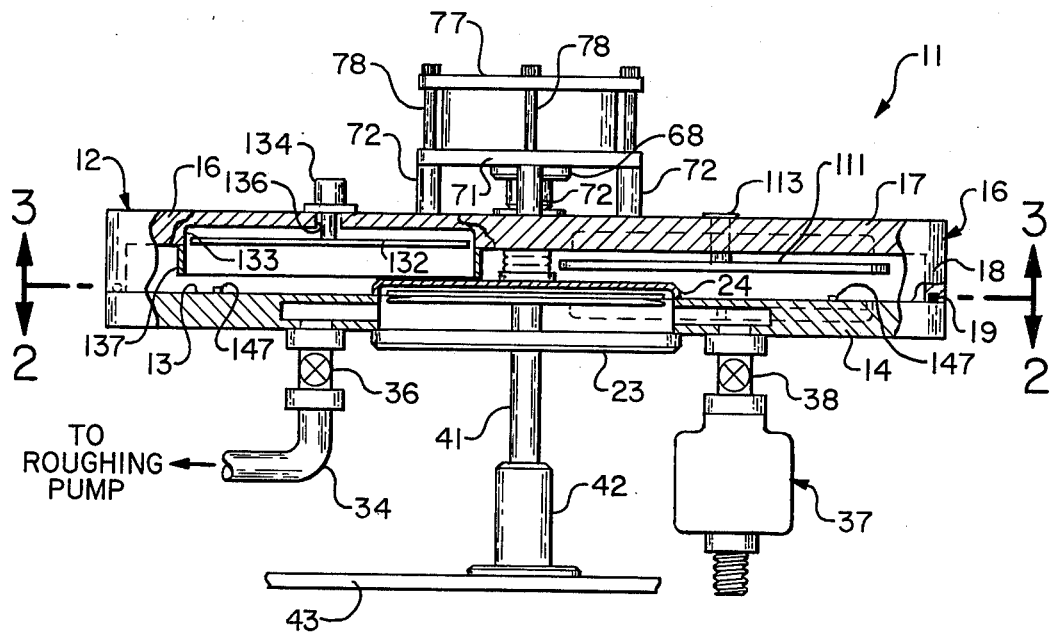
FIG. 1 is a side elevational view, partly in cross-section, of a vacuum sputtering apparatus incorporating the present invention.

The vacuum sputtering apparatus 11 shown in the drawing consists of a generally cylindrical housing 12 which is formed in a main vacuum chamber 13 therein. By way of example, the chamber 13 can be of any suitable size as, for example, appproximately 30 inches in diameter and 4 inches in height. The housing 12 consists of a cylindrical base plate 14 formed of a material such as anodized aluminum because of its hygroscopic properties as hereinafter described. A cover 16 is mounted over the base plate 14 and forms a sealing engagement therewith. The cover 16 is provided with a planar top wall 17 which has a circular side wall 18 formed integral therewith. The cover 16 carries an O-ring 19 for forming a seal between the cover 16 and the base plate 14.

A load lock assembly 21 (FIG. 5) is mounted on the housing 12 which is utilized for a purpose hereinafter described. The load lock assembly is associated with a large circular hole or opening 22 which is provided in the base plate 14 and extends through the base plate 14 in a region off-center of the base plate 14. The load lock assembly 21 includes lower and upper sealing plates 23 and 24. The lower sealing plate is provided with an annular groove 26 which has an O-ring 27 disposed therein which is adapted to form a sealing engagement with the lower surface of the base plate 14. The upper sealing plate 24 is provided with a downwardly depending lip 28 which carries an O-ring 29 that is adapted to form a sealing engagement with the top surface of the base plate 14 so that when the sealing plates 23 and 24 are in position, a lock chamber 31 is formed by the sealing plates 23 and 24 and by the side wall 30 forming the hole 22 of the base plate 14.

Means is provided for establishing a vacuum within the lock chamber 31 and includes a bore 32 on one side of the lock chamber and another bore 33 on the other side of the lock chamber with both of the bores being formed in the lower sealing plate 23 to form passages. The bore 32 is in communication with piping 34 (FIG. 1) which includes a valve 36 (diagrammatically illustrated) which is connected to a roughing pump (not shown) of a conventional type. The other bore 33 is in communication with a diffusion pump and cold trap assembly 37 of a conventional type which also includes a shut-off valve 38 which is diagrammatically illustrated.

Figure 5:
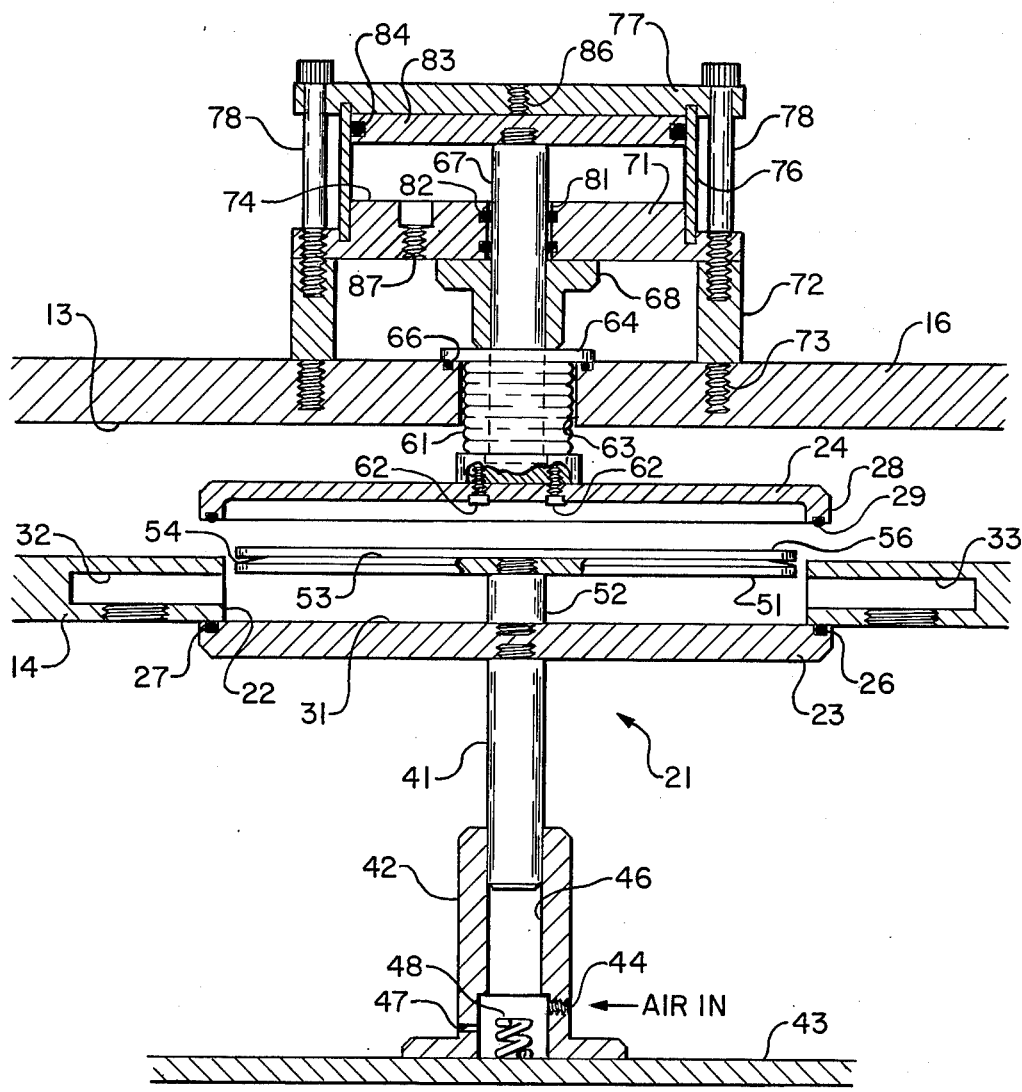
FIG. 5 is an enlarged cross-sectional view taken along the line 5—5 of FIG. 4 which particularly shows the lock station.

Means is provided for controlling movement of the lower sealing plate 23 by moving it toward and away from the lower surface of the base plate 14 and consists of a piston 41 which is threaded into the base plate 23 as shown in FIG. 5. The piston 41 is slidably mounted in a cylinder 42 which is carried by a bottom support plate 43. The cylinder 42 is provided with a threaded hole 44 which is adapted to be connected to fittings (not shown) which, in turn, are connected to a source of air under pressure which can be utilized for introducing air under pressure into a chamber 46 provided within the cylinder 42 to cause upward movement of the piston 41 in the chamber 46. An orifice 47 is also provided in the cylinder 42 and is connected to piping (not shown) having valving therein to permit air in the chamber 46 to be vented to the atmosphere when it is desired to lower the piston 41. A coil spring 48 is disposed in the lower portion of the chamber 46 and is adapted to be engaged by the lower extremity of the piston 41 to cushion the downward movement of the piston 41 when the bottom sealing plate 23 is moved to the open position.

Figure 4:
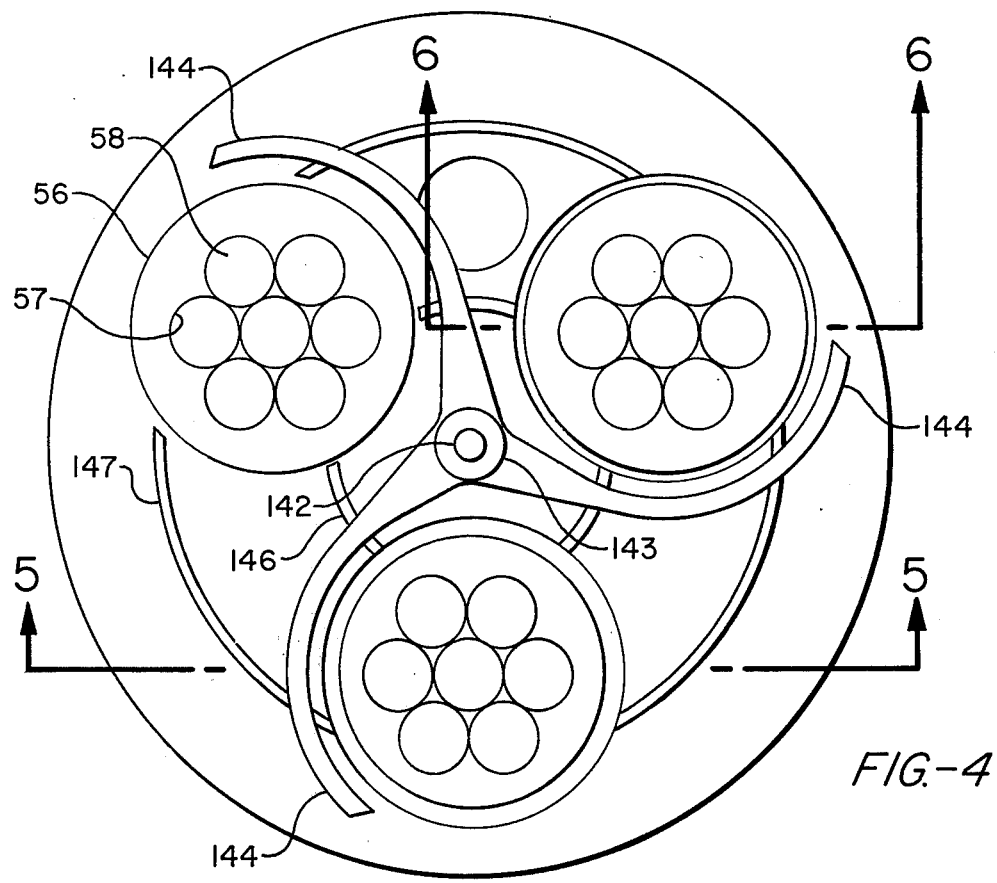
FIG. 4 is a view similar to FIG. 2 but showing the wafer carrying platens in place.

A cylindrical support pedestal 51 formed of a suitable material such as hard anodized aluminum is mounted upon cylindrical post 52 which is threaded into the pedestal. The lower extremity of the post 52 is threaded into the lower sealing plate 23 as shown in FIG. 5. The upper surface 53 of the support pedestal 51 is generally planar. However, the outer margin of the same is provided with a downwardly inclined bevel 54. The support pedestal 51 is of a size so that it can carry a conventional wafer platen 56 formed of a suitable material such as quartz and which is provided with a plurality of upwardly facing wells 57 formed therein which are adapted to receive wafers 58 (FIG. 4).

Means is provided for retaining the top sealing plate 24 in sealing engagement with the upper surface of the base plate 14. In this connection, it should be appreciated that when the lock chamber 31 is evacuated, atmospheric pressure will hold the lower sealing plate 23 in engagement with the base plate 14. However, when the large or main chamber 13 is evacuated, it can be seen that this will not be the case with respect to the sealing plate 24 in which atmospheric pressure in the lock chamber 31 will urge the sealing plate 24 away from the base plate 14. This means for retaining the top sealing plate 24 consists of a metal bellows assembly 61 (FIG. 5) of a conventional type which is secured to the top of the top sealing plate 24 by screws 62. The bellows assembly 61 extends through a hole 63 provided in the cover 16 and is provided with a flange 64 which engages an O-ring 66 carried by the cover 16 to form a sealing engagement between the bellows assembly 61 and the cover 16. A piston rod or shaft 67 is secured to the lower extremity of the bellows assembly 61 and extends upwardly through the bellows assembly. The piston rod 67 also extends upwardly through a bushing 68 mounted on the piston rod. The bushing 68 engages the flange 64 of the bellows assembly 61. The upper extremity of the bushing 68 is engaged by a cylindrical plate 71. The plate 71 is supported by a plurality of spaced stand-offs 72 which are secured to the top of the cover 16 by screws 73. The plate 71 forms the bottom wall of a chamber 74. The chamber 74 is also defined by a cylindrical wall 76 which is secured to the plate 71 by suitable means such as welding to form an air-tight seal. The top plate 77 is mounted on the cylindrical wall 76 and is also secured thereto to form an air-tight seal to completely enclose the chamber. The top plate 77 and the bottom plate 71 with the cylindrical wall 76 therebetween are secured to the stand-offs 72 by suitable means such as the cap screws 78 shown in FIG. 5.

A piston rod or shaft 67 extends through a bore 81 provided in the bottom plate 71 and a sealing engagement is established between the piston rod 67 and the plate 71 by a pair of spaced annular O-rings 82. A piston member or plate 83 is mounted upon the piston rod 67 in a suitable manner such as by the threaded connnection shown in FIG. 5 and is adapted to move in the chamber 74. The outer margin of the piston member 83 carries an O-ring 84 for making sealing engagement with the cylindrical side wall 76. The top wall 77 is provided with a threaded bore 86 to give access to the upper part of the chamber 74. The bottom plate 71 is similarly provided with a threaded bore 87. The threaded bore 87 is adapted to be connected to a source of air under pressure whereby the piston member 83 can be raised to carry with it the upper sealing member 24. Conversely, the threaded bore 86 is provided so that the upper portion of the chamber 74 can be connected to a source of pressure to cause the piston member 83 to move downwardly and to retain the upper sealing member 24 in engagement with the top surface of the base plate 14.

The base plate 14 is provided with an evacuation port 91 (FIG. 2) for the main chamber 13. The evacuation port 91 is connected to a suitable evacuation system (not shown) such as a diffusion pump and cold trap.

The main chamber 13 is provided with a plurality of work stations. As hereinbefore described, the base plate 14 is provided with the hole or opening 22 which serves as a loading work station 93 as hereinafter described. Looking downwardly (FIG. 2) from the top with respect to the base plate 14, the base plate is also provided with a sputter etch work station 94 which is offset from the center of the base plate in a counterclockwise direction from the loading station. This sputter etch station consists of a platform 96 formed of a suitable material such as nickel. The circular platform 96 is disposed in the cylindrical recess 97 (FIG. 6) provided in the top surface and extending downwardly through the top surface of the base plate 14. The recess 97 is a size so that it is slightly greater than the diameter of the platform 96. The platform 96 is mounted upon an RF feed-through structure 98 of a conventional type which extends through a bore 99 provided in the base plate 14. An O-ring 101 is provided for establishing a seal between the RF feed-through structure and the base plate 14. It will be noted that the platform 96 has a size which is slightly less than that of the recess 97 so that it is spaced from the plate 14 and is insulated from the plate 14 by the RF feed-through structure 98. In addition, it should be noted that the upper surface of the platform 96 is generally flush with the upper surface of the base plate 14. The base plate 14 is maintained at ground, whereas the platform 96 is connected through the RF feed-through structure by a cable 102 to an impedance matching network 103. The impedance matching network 103 (FIG. 2) is connected by a cable 104 to a radio frequency power supply 106 of a conventional type such as one operating at approximately 13 megahertz and delivering 2500 kilowatts of power.

An anode catcher plate 111 (FIG. 6) forms a part of the sputter etch station 94 and is formed of a suitable material such as aluminum. Suitable means is provided for mounting the anode catcher plate 111 on the cover 16 so that it is insulated therefrom. Thus, there is provided a large cap screw 113 which extends through a hole 114 provided in the cover 16. The cap screw 113 is provided with an insert 116 of a suitable insulating material. A screw 117 is threaded into the insert 116 and is also threaded into the top of the anode catcher plate 111. In this way it can be seen that the anode catcher plate 111 is insulated from the cap screw 113 and the cover 16. Means is provided for holding the cap screw 113 in place and consists of a nut 121 which is threaded onto the cap screw. The cap screw is provided with a slit 122 extending longitudinally thereof for quickly venting trapped air during pump down.

Figure 6:
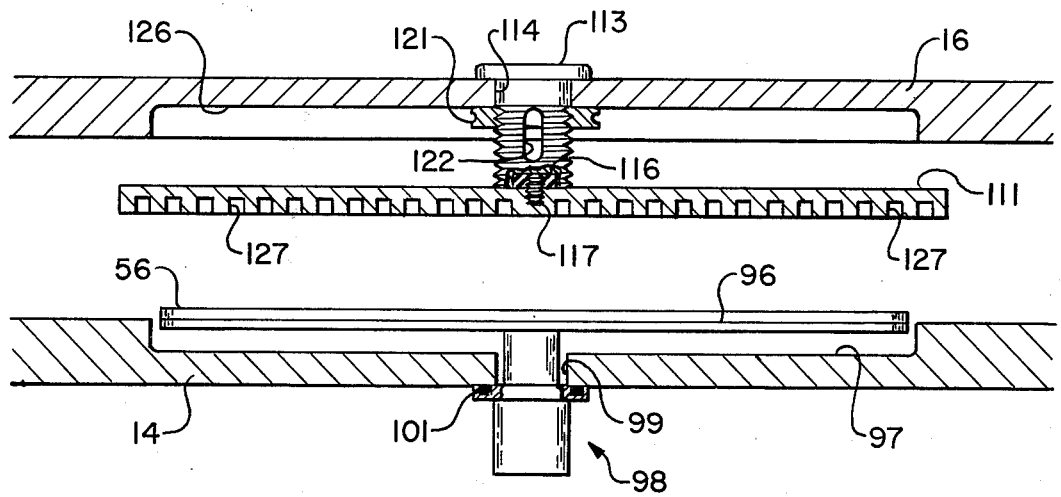
FIG. 6 is a cross-sectional view taken along the line 6—6 of FIG. 4 and shows the sputtering work station.

The cover 16 is provided with a circular recess 126 (FIG. 6) which extends inwardly from the bottom surface of the cover plate and generally overlies the anode catcher plate but has a diameter which is slightly less than that of the anode catcher plate. In order to make it possible for the catcher plate 11 to catch or collect more material before is starts scaling off, the catcher plate 111 has been provided with a plurality of circular concentric grooves 127 which extend through the bottom surface of the anode catcher plate 111 as shown in FIG. 6 and which generally overlie the platform 96.

In addition to the loading station 93 and the sputter etch station 94, there is provided a sputter deposition station 131 (FIGS. 2 and 3) which is also offset from the center and is disposed counter-clockwise with respect to the sputter etch station 94. The sputter deposition station 131 includes a cathode plate 132 which is generally cylindrical in shape. The cathode plate is constructed in a manner similar to that described in U.S. Pat. No. 3,855,612. As described therein, it consists of nickel having stripes of platinum bonded thereto. The cathode plate 132 is mounted in the manner substantially identical to the sputter etch platform 96. Thus, it is disposed within a recess 133 opening through the bottom surface of the cover 16 and is mounted on a RF feed-through structure 132 which extends through a bore 136 provided in the cover 16. A suppression ring 137 which is cylindrical in form is secured to the bottom surface of the cover by suitable means such as screws (not shown). As shown in FIG. 1, the suppression ring 137 circumscribes the cathode plate 132 and extends downwardly therefrom into the chamber 13.

Figure 2:
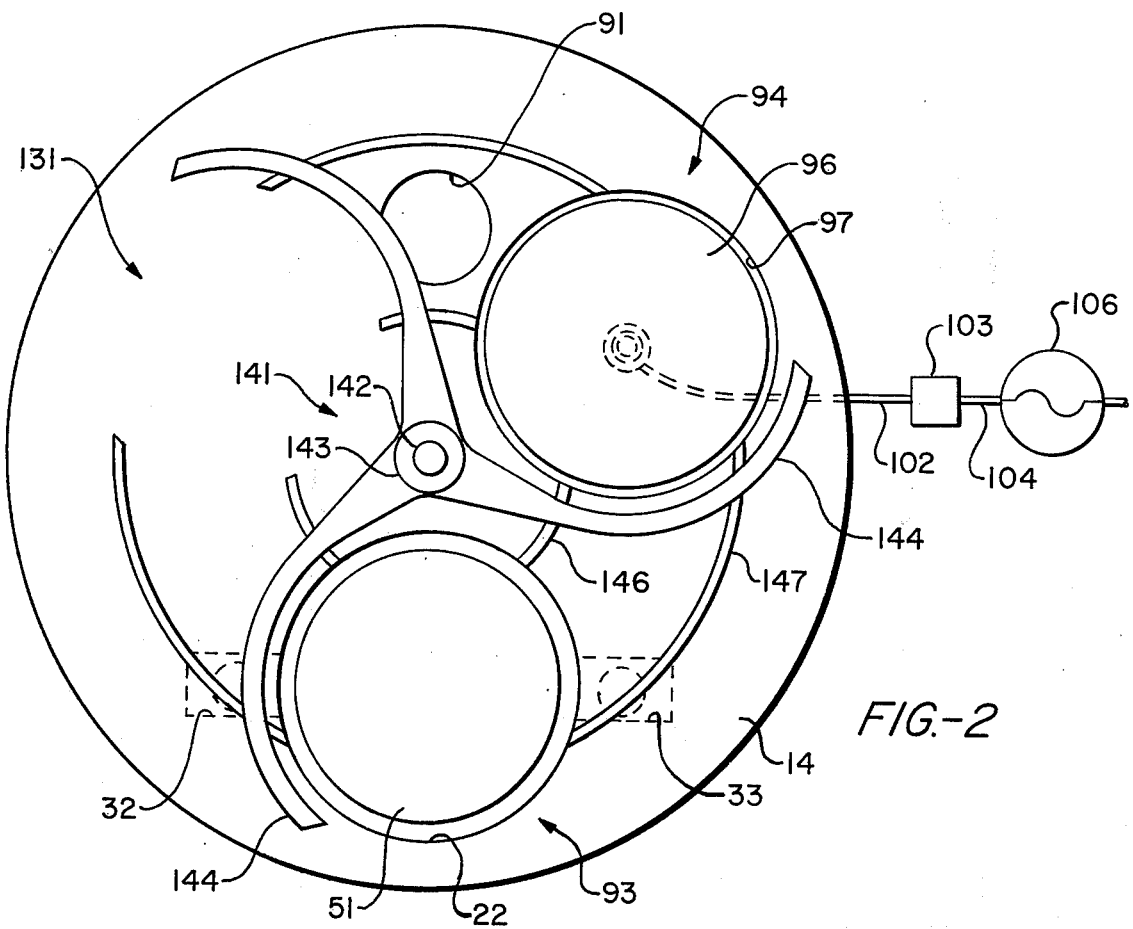
FIG. 2 is a cross-sectional view taken along the line 2—2 of FIG. 1.
Figure 3:
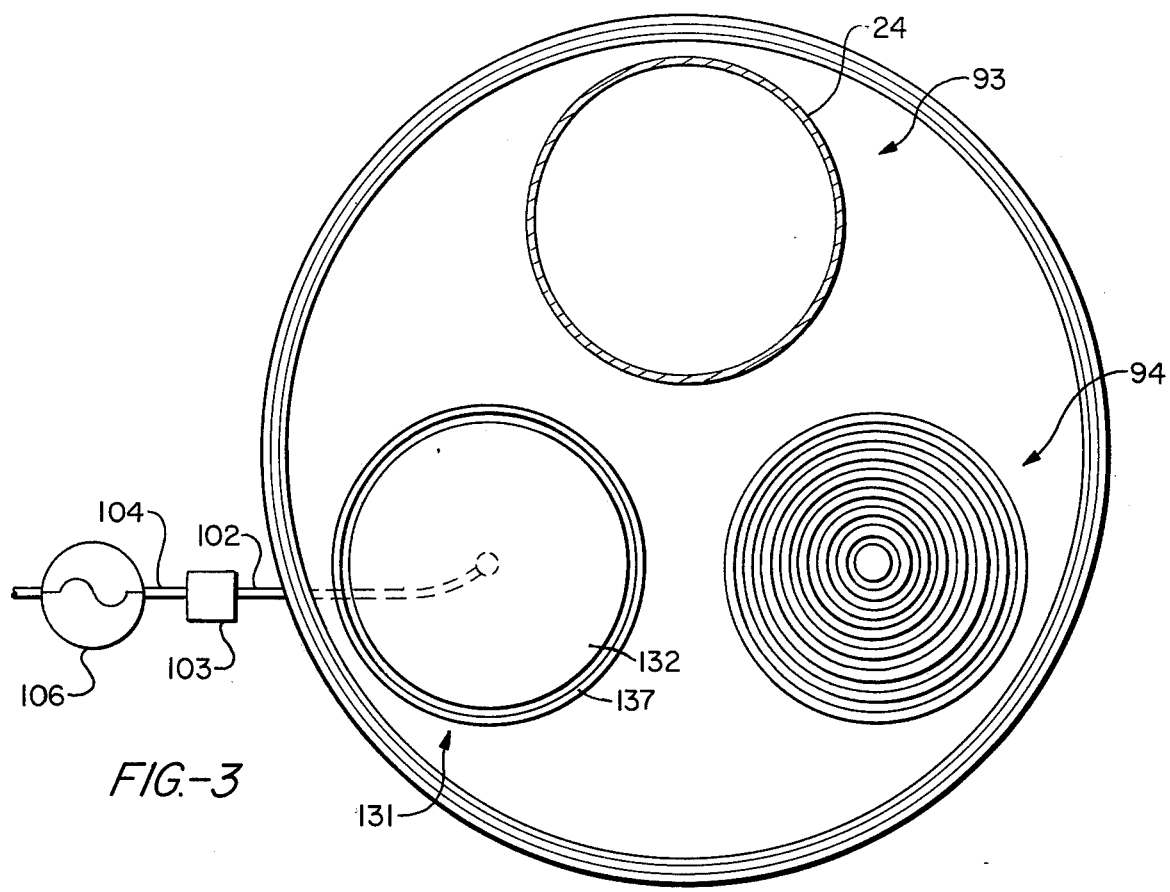
FIG. 3 is a cross-sectional view taken along the line 3—3 of FIG. 1.

Means is provided for advancing the wafer platens 56 from one station to another and consists of a sweep arm assembly 141 (FIGS. 2 and 4). The sweep arm assembly includes a shaft 142 which extends downwardly through a sealed bearing assembly (not shown) provided in the base plate 14. The shaft 142 is driven by an electric motor in a conventional manner which is under the control of the operator. A collar 143 is mounted on the shaft and has secured thereto a plurality of arcuate arms 144 which extend outwardly from the shaft 142 in a generally radial direction. As can be seen particularly from FIG. 2, the arms are curved in a generally clockwise direction and have a curvature which generally corresponds to the curvature of the platens 56. They also have a size so they can engage the sides of the platens and carry them therewith as the sweep arm assembly 141 is rotated by the motor. In view of the fact that there are three separate stations provided within the vacuum chamber 13, namely the loading station 93, the sputter etch station 94 and the deposition station 131, only three arms are provided which are generally spaced 120° apart so that the platens can be progressively advanced through the three stations as hereinafter described.

In order to facilitate advance of the platens through the three stations, a pair of spaced arcuate rails 146 and 147 have been provided on the top surface of the base plate 14. As can be seen (FIGS. 2 and 4), the rails are substantially continuous except for a discontinuities in the loading station 93, the sputter etch station 94 and the sputter deposition station 131.

Operation and use of the vacuum sputtering apparatus in performing the present method may now be briefly described as follows. Let it be assumed that the vacuum sputtering apparatus is in a position in which the load lock assembly 21 is in a position with the lower sealing plate 23 in a lowermost position. Let is also be assumed that it is desired to conduct certain operations on wafers of a suitable type such as silicon wafers as described in U.S. Pat. No. 3,855,612, and these wafers have been placed in the wells 57 which have been formed in the platens 56. One of the platens is loaded with the wafers and the plane is inserted on top of the support pedestal 51. As soon as this has been accomplished, the operator operates a control to cause air under pressure to be introduced into the chamber 46 to cause the piston 41 to rise and to carry with it the lower sealing plate 23. This continues until the lower sealing plate 23 comes into engagement with the bottom surface of the base plate 14. Assuming that the top sealing member 24 is in place, the chamber 31 can be pumped down under manual or under automatic control as soon as the lower sealing plate 23 makes engagement with the base plate 14. The pumping is carried out in a conventional manner such as by first using the roughing pump connected to the piping 34 and then closing valve 36 and placing the high vacuum pump in operation to bring the vacuum in the lock chamber down to a suitable value such as, for example, $5 \times 10^6$ Torr. It is the practice in the present method to bring the vacuum in the lock chamber 31 down to a value which is substantially equal to the vacuum which is maintained in the main chamber 13. It has been found that this step is relatively important because it removes substantially all the impurities of the wafers and the platen from the outside world, and therefore, leaves the main chamber uncontaminated.

As soon as the vacuum in the lock chamber has reached the vacuum which is near that in the main chamber 13, the top sealing plate 24 is moved upwardly by introducing air under pressure through the threaded bore 87 into the chamber 74 to move the piston member 83 and the top sealing plate 24 upwardly by compressing the bellows assembly 61 and to move it out of the way so that the sweep arm assembly 141 can be operated.

As soon as the upper sealing plate 24 has been moved to its uppermost position, the sweep arm assembly 141 is actuated to cause it to rotate in a counter-clockwise direction as viewed from the top through 120°. This causes one of the arms 144 to engage the platen 56 carried on the platform 51 and to move it in a counter-clockwise direction off of the platform onto the rails 146 and 147 and onto the sputter etch platform 96 in the sputter etch station 94. As soon as this has been accomplished, the means for advancing the sweep arm is operated to retract the sweep arm by approximately 30° by rotating it in a clockwise direction so that is is free of the platens. The retraction of the sweep arm assembly is necessary so that it will not short out the RF system which is utilized in the sputter etch station and also in the deposition station.

As soon as this has been accomplished, the top sealing member 24 is again brought down into engagement with the top surface of the plate by introducing air under pressure through the threaded bore 86 to move the piston 83 and the top sealing member 24 downwardly so that the top sealing member 24 engages the top surface of the bottom plate 14. The lock chamber 31 is then vented to the atmosphere. Thereafter, the chamber 46 is vented to the atmosphere through the opening 47 to permit the lower sealing plate 28 to drop downwardly. If there is a platen on the platform which has been completed in the manner hereinafter described, the operator removes the platen with the wafers thereon from the platform. A new platen on which wafers are to be treated is then placed on the platform and the same sequence of operations is repeated. The lock chamber 31 is again pumped down, the upper sealing plate 24 is raised and the platen is advanced from the platform 51 in the loading station into the sputter etch station. The platen which is in the sputter etch station is moved to the deposition station and the platen which is in the deposition station is moved to the loading station.

From the foregoing, it can be seen that three separate operations can be carried out. Thus, during the time that operations are being performed in the loading station, the sputter etch operation can be carried out in one station and a deposition operation can be carried out in another station. These operations are a conventional type and will not be described in detail. They are generally of the type which can be carried out in RF sputtering systems such as described in U.S. Pat. No. 3,855,612.

In connection with the foregoing, it should be appreciated that if operations are to be performed which require additional steps, this could be readily accomplished by providing a larger main vacuum chamber and providing additional stations in the vacuum chamber to accommodate the additional steps. From the foregoing mode of operation, it can be seen that there has been provided an intermittent rotary system in which the sweep arm assembly 141 is intermittently progressively advanced to advance the wafer carrying from one station to another and that at the time one platen is being moved from the loading station, a completed platen is moved into the loading station. This makes is possible to utilize a single lock station for loading and unloading platens carrying wafers into the main chamber. This is advantageous in that it permits a single operator to operate the apparatus and to perform both the loading and unloading operations with a minimum of movement.

The use of hard black anodized aluminum for the base plate has been found to be particularly advantageous. It is very hard which makes it relatively impervious to mechanical damage. In addition, it has an advantage in that is is hygroscopic which causes it to absorb moisture within the main vacuum chamber 13. This is particularly advantageous because water is one of the largest contaminants in a vacuum chamber. As can be appreciated, most of the water would be removed during pumping of the lock chamber. However, any residual water which would remain in the lock chamber would be absorbed by the anodized aluminum.

It is apparent from the foregoing that there has been provided a vacuum sputtering apparatus which can be utilized in a manual or automated form for sputter etching for atomically clean surfaces and for metal coating to provide a Schottky or conductor metal by RF sputtering on semiconductor devices. The rotary motion utilized with the sweep arm assembly makes it possible to obtain a high material through-put while only requiring one loading and unloading port with relatively small platen diameters. In addition, because it is possible to sputter etch and to perform deposition operations at two different platen sites, the through-put through the apparatus is also increased. The apparatus is also constructed in such a manner so that it is relatively inexpensive and can be readily cleaned. The use of the grooved anode catcher plate 111 makes it possible to collect much greater amounts of material before scaling will occur and therefore, reduces the down-time of the apparatus required for cleaning operations.

What is claimed is:

1. In a vacuum sputtering apparatus for treating articles, a housing forming a main vacuum chamber having a plurality of work stations therein, at least one sputtering apparatus mounted in at least one of the work stations, means connected to the vacuum chamber for forming a vacuum in the vacuum chamber, said housing having a wall with an opening formed therein through which the articles can be inserted and removed from the main vacuum chamber, first and second sealing members for forming sealing engagement with opposite sides of the wall and forming in combination with the wall a lock chamber, means connected into the lock chamber to create a vacuum in the lock chamber, means for moving the first sealing member into and out of engagement with said wall whereby articles may be inserted into and removed from said chamber, means for moving said second sealing member into and out of engagement with said wall whereby when said sealing member is out of engagement with said wall, articles which have been inserted into the lock chamber can be removed, and means in the main chamber for intermittently advancing articles from the lock chamber and moving the same progressively through the work stations in the main vacuum chamber and thence back into the lock chamber whereby articles can be inserted into the lock chamber, removed therefrom and advanced progressively through the work stations and thereafter inserted in the lock chamber for removal therefrom.

2. Apparatus as in claim 1 wherein said first sealing member is disposed exterior of the vacuum chamber and wherein said second sealing member is disposed interior of the vacuum chamber.

3. Apparatus as in claim 2 wherein said means for intermittently advancing the articles includes a sweep arm assembly having a plurality of arms disposed in said main chamber and wherein said sweep arm assembly is positioned so that the sweep arm assembly can be advanced through the lock chamber.

4. Apparatus as in claim 3 together with a plurality of platens adapted to carry said articles and wherein said sweep arm assembly is adapted to engage said platens, said housing having arcuate rails disposed within the vacuum chamber for supporting said platens as they are advanced from one work station to the next.

5. Apparatus as in claim 1 wherein said means for moving said first sealing member includes a fluid actuatable member and a platform carried by said first sealing member, said platform having a planar surface adapted to receive at least one of said platens.

6. Apparatus as in claim 1 wherein said wall is the bottom wall of said housing chamber and wherein said first sealing member engages the outer surface of the bottom wall and wherein the upper surface of said platen is substantially flush with the upper surface of the bottom wall when said first sealing member is in engagement with said wall.

7. Apparatus as in claim 1 wherein said sputtering apparatus is sputter etching apparatus.

8. Apparatus as in claim 1 wherein said sputtering apparatus is sputter deposition apparatus.

* * * * *